US010715024B2

(12) United States Patent
Wang

(10) Patent No.: US 10,715,024 B2
(45) Date of Patent: Jul. 14, 2020

(54) ELECTRICITY GENERATING DEVICE, ELECTRIC SOURCE AND SENSOR

(71) Applicant: BOE TECHNOLOGY GROUP CO., LTD., Beijing (CN)

(72) Inventor: Hong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 387 days.

(21) Appl. No.: 15/698,269

(22) Filed: Sep. 7, 2017

(65) Prior Publication Data

US 2018/0069463 A1 Mar. 8, 2018

(30) Foreign Application Priority Data

Sep. 7, 2016 (CN) .................... 2016 2 1043195 U

(51) Int. Cl.
| | |
|---|---|
| *H02K 35/02* | (2006.01) |
| *H02K 41/03* | (2006.01) |
| *G01R 19/165* | (2006.01) |
| *H01F 10/30* | (2006.01) |
| *H02K 1/17* | (2006.01) |

(52) U.S. Cl.
CPC ......... *H02K 41/031* (2013.01); *G01R 19/165* (2013.01); *H01F 10/30* (2013.01); *H02K 1/17* (2013.01); *H02K 35/02* (2013.01)

(58) Field of Classification Search
CPC .. H02K 1/00; H02K 1/02; H02K 1/04; H02K 1/06; H02K 1/12; H02K 1/17; H02K 1/18; H02K 5/00; H02K 5/02; H02K 5/04; H02K 15/02; H02K 15/024; H02K 15/03; H02K 35/00; H02K 35/02; H02K 35/04; H02K 35/06; H02K 41/03; H02K 41/031
USPC .. 310/10, 12.12, 12.21, 12.24, 12.25, 12.26, 310/12.31, 15, 21, 27, 29
See application file for complete search history.

(56) References Cited

U.S. PATENT DOCUMENTS

| | | | | |
|---|---|---|---|---|
| 5,325,254 A | * | 6/1994 | Cooperrider | G11B 5/3116 360/122 |
| 2010/0213773 A1 | * | 8/2010 | Dong | H02K 33/16 310/25 |
| 2012/0013130 A1 | * | 1/2012 | Jung | F03B 13/262 290/55 |
| 2013/0208390 A1 | * | 8/2013 | Singh | A61N 1/0553 361/139 |
| 2014/0062223 A1 | * | 3/2014 | Park | H02K 35/04 310/12.12 |
| 2017/0140862 A1 | * | 5/2017 | Yun | H01F 10/12 |
| 2017/0198401 A1 | * | 7/2017 | Phillips | H02K 7/1853 |

* cited by examiner

*Primary Examiner* — Nguyen Tran
*Assistant Examiner* — David A. Singh
(74) *Attorney, Agent, or Firm* — Nath, Goldberg & Meyer; Joshua B. Goldberg

(57) ABSTRACT

An electricity generating device including a magnet array; and an inductive body having one or more metal wires. The inductive body and the magnet array are movable relative to each other and a magnet mounting structure, on which the magnet array is mounted. The inductive body is fixed to the magnet mounting structure. The electricity generating device has a simple structure, is easy to manufacture, achieves high efficiency of electricity generation, and is easy to carry.

16 Claims, 7 Drawing Sheets

ELECTRICITY GENERATING DEVICE, ELECTRIC SOURCE AND SENSOR

CROSS-REFERENCE TO RELATED APPLICATION

The present application claims the priority of Chinese Utility Model Application No. 201621043195.9, filed on Sep. 7, 2016, the contents of which are incorporated herein in their entirety by reference.

TECHNICAL FIELD

The present disclosure relates to an energy conversion device, and in particular relates to an electricity generating device, an electric source and a sensor.

BACKGROUND

As the development of industrial integration and miniaturization of industrial products, power consumption of products is decreasing and there are higher requirements for electric power sources with low power consumption. Since a power source module with a large volume may cause limitation to miniaturization of a product, it has become a trend to provide a self-electricity-generating device in a product to supply electric power to the product.

Among existing self-electricity-generating devices, a kind of electricity generating device that converts optical energy into electric energy by photoelectric conversion cannot be widely applied because it is subject to the weather. Moreover, such an electricity generating device requires a large reaction area to perform photoelectric conversion, which may prevent achievement of functionalities of a miniaturized product.

An electricity generating device that converts kinetic energy into electric energy, as another kind of existing self-electricity-generating device, cannot be widely used because of low conversion efficiency and complex structure.

Therefore, miniaturizing a self-electricity-generating device while ensuring a high conversion efficiency and a simple structure, is an urgent problem to be solved in the art.

SUMMARY

In view of the above, in order to at least partly solve the above technical problem, embodiments of the present disclosure provide an electricity generating device, an electric source and a sensor, which can achieve advantages such as compact structure, easiness to miniaturize in size, high conversion efficiency, simple manufacturing process, and the like.

According to an aspect of the present disclosure, there is provided an electricity generating device, comprising:

a magnet array, and an inductive body having one or more metal wires, the magnet array comprising a plurality of magnets, wherein the inductive body and the magnet array are movable relative to each other; and a magnet mounting structure, on which the magnet array is mounted, wherein the inductive body is fixed to the magnet mounting structure, and the magnet array is movable relative to the magnet mounting structure.

In an embodiment of the present disclosure, the magnet mounting structure may comprise a mounting substrate and a flexible body, one end of the flexible body may be connected to the mounting substrate, the other end of the flexible body may be connected to a magnet of the magnet array.

In an embodiment of the present disclosure, the magnet mounting structure may comprise a mounting cavity board with micro cavities provided therein, the magnet of the magnet array may be mounted in the micro cavity, a flexible connector may be provided between a sidewall of the micro cavity and the magnet, one end of the flexible connector may be connected to the sidewall of the micro cavity, and the other end thereof may be connected to the magnet.

In an embodiment of the present disclosure, the magnet mounting structure may comprise a mounting cavity board with micro cavities provided therein and a restriction board, the magnet of the magnet array may be freely placed in the micro cavity, and the restriction board may be mounted at an opening of the micro cavity.

In an embodiment of the present disclosure, a direction in which magnetic lines of the magnet may be emitted is consistent with a height direction of the micro cavity, and a width direction of the magnet may be vertical to the direction in which magnetic lines of the magnet are emitted, a maximum width of the magnet may be smaller than a height of the micro cavity.

In an embodiment of the present disclosure, the inductive body may comprise one or more wire layers, the metal wires may be provided in the wire layers; and in a case where there are more than one wire layers, a dielectric layer may be provided between any two adjacent wire layers.

In an embodiment of the present disclosure, directions in which metal wires in each of the one or more wire layers may be arranged are parallel to each other, or, metal wires in each of the one or more wire layers may be arranged in a shape of rectangular wave.

In an embodiment of the present disclosure, a metal wire connecting wire configured to adjust an induced electromotive force may be provided at an edge of the wire layer, the metal wire connecting wire comprising an intra-layer connecting wire connecting adjacent metal wires within one wire layer; and in a case where there are more than one wire layers, the metal wire connecting wire may further comprise an interlayer connecting wire connecting metal wires of adjacent wire layers.

In an embodiment of the present disclosure, in a case where there are more than one wire layers, directions in which the metal wires in adjacent wire layers extend may be perpendicular to each other.

In an embodiment of the present disclosure, the magnet may be a thin film magnet.

In an embodiment of the present disclosure, the thin film magnet may comprise a glass substrate, a bottom layer provided on the glass substrate, a function layer provided on the bottom layer and an insulation layer provided on the function layer, the function layer may be a magnetic film recorded with magnetic signals.

In an embodiment of the present disclosure, the function layer may be a magnetic film recorded with magnetic signals with alternating positive and negative polarities and with equal intervals therebetween.

In an embodiment of the present disclosure, the electricity generating device may further comprise a rectifier circuit having a first input terminal, a second input terminal, a first output terminal and a second output terminal, both ends of each of the metal wires may be connected to the first input terminal and the second input terminal, respectively, the first output terminal and the second output terminal of the rectifier circuit may be connected to a first output line and a second output line of the electricity generating device, respectively.

In an embodiment of the present disclosure, there may be a plurality of metal wires, and there may be a plurality of rectifier circuits, the plurality of rectifier circuits may be connected in series or in parallel.

In an embodiment of the present disclosure, in a case where the magnet array is moving relative to the inductive body, the metal wires in the inductive body may incise magnetic lines of a magnetic field generated by the magnet array.

According to an aspect of the present disclosure, there is provided an electric source, comprising the electricity generating device according to the present disclosure, a battery and an electric source control circuit, wherein the electricity generating device is connected to the electric source control circuit, the electric source control circuit is connected to the battery, and the electricity generating device charges the battery through the electric source control circuit.

According to an aspect of the present disclosure, there is provided a sensor, comprising the electricity generating device according to the present disclosure, a capacitor and an output line, wherein two output terminals of the electricity generating device are connected to both ends of the capacitor by the output line, respectively.

The electricity generating device, the electric source and the sensor provided by the present disclosure have simple structures, are easy to manufacture, achieve high efficiency of electricity generation, and are easy to carry, having various applications in wearable apparatuses.

DETAILED DESCRIPTION

In order to provide a better understanding of the technical solutions of the present disclosure to those skilled in the art, an electricity generating device, an electric source and a sensor according to embodiments of the present disclosure will be described in further detail below in conjunction with the drawings.

Figure 1:
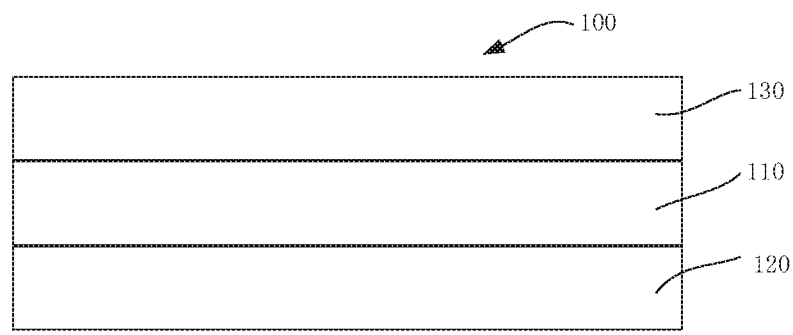
FIG. 1 is a schematic diagram of a structure of an electricity generating device according to an embodiment of the present disclosure.

FIG. 1 is a schematic diagram of a structure of an electricity generating device 100 according to an embodiment of the present disclosure. The electricity generating device 100 may be a miniature electricity generating device.

As shown in FIG. 1, the electricity generating device 100 includes a magnet array 110 and an inductive body 130, which may be provided above or below the magnet array 110. The magnet array 110 and the inductive body 130 may move relative to each other. The inductive body 130 may include metal wires. When the magnet array 110 moves relative to the inductive body 130, the metal wires in the inductive body 130 may incise (i.e. cut) magnetic lines of a magnetic field generated by the magnet array 110 (hereinafter referred to as "magnetic lines of the magnet array 110"), so that an induced current is generated in the inductive body 130. The magnet array 110 may be mounted on a magnet mounting structure 120, which may restrict a motion of the magnet array 110. The inductive body 130 and the magnet mounting structure 120 may be fixedly connected to each other.

As described above, when the magnet array 110 moves relative to the inductive body 130, an induced current or an induced electromotive force (EMF) may be generated in the inductive body 130. The induced current or EMF may drive an external load connected to the inductive body 130 to operate, thereby realizing an electricity generating function. The magnet array 110 and the inductive body 130 have small volumes, and they may be provided opposite to each other, thus, the electricity generating device 100 has a small volume and is easy to carry.

Figure 2:
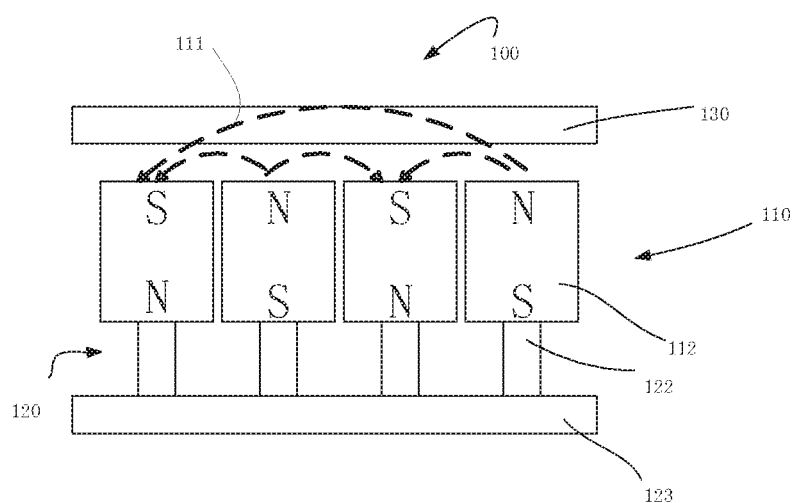
FIG. 2 is a schematic diagram of a structure of an electricity generating device according to an embodiment of the present disclosure.
Figure 4:
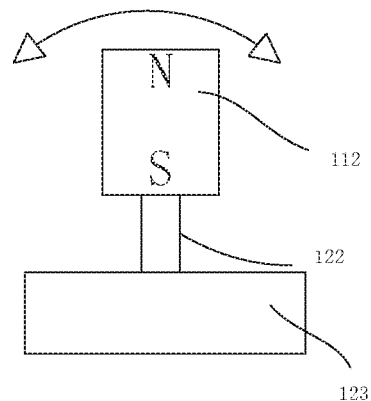
FIG. 4 is a schematic diagram showing motion of a magnet in an electricity generating device according to an embodiment of the present disclosure.

FIG. 2 is a schematic diagram of a structure of an electricity generating device according to an embodiment of the present disclosure. As shown in FIG. 2, the magnet array 110 may include a plurality of magnets 112. The magnet mounting structure 120 may include a mounting substrate 123 and a plurality of flexible bodies 122 provided on the mounting substrate 123 and extending along a direction away from the mounting substrate 123, and the flexible bodies 122 may be arranged approximately parallel to each other with equal heights. One or more magnets 112 may be provided on each of the flexible bodies 122. When the mounting substrate 123 of the magnet mounting structure 120 is subject to a driving force and starts to move towards a certain direction, because of the inertia of the magnet array 110, relative motion may occur between the magnet array 110 and the mounting substrate 123, and the magnet array 110 will move towards an opposite direction relative to the mounting substrate 123. The flexible bodies 122 serve as a buffering member between the magnet array 110 and the mounting substrate 123. For example, as shown in FIG. 4, the magnet 112 may swing right and left on the flexible body 122.

Figure 3:
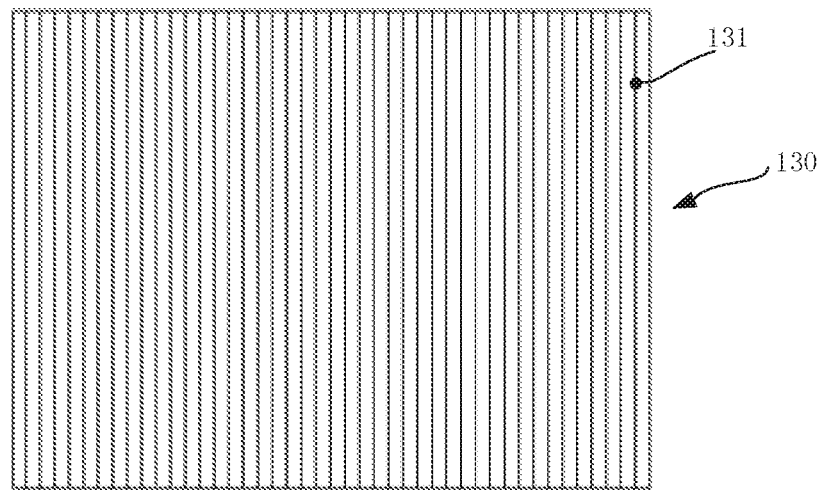
FIG. 3 is a schematic diagram of a structure of an inductive body in an electricity generating device according to an embodiment of the present disclosure.

As described above, the magnet array 110 and the magnet mounting structure 120 may move relative to each other, and since the magnet mounting structure 120 and the inductive body 130 are fixedly connected, the magnet array 110 may also move relative to the inductive body 130, such that magnetic lines of the magnet array 110 are incised by the inductive body 130. As shown in FIGS. 2 and 3, metal wires 131 in the inductive body 130 may incise magnetic lines 111 of the magnet array 110 to generate an induced EMF.

In an embodiment of the present disclosure, the mounting substrate 123 may be a non-magnetic-conducive substrate, to effectively isolate a magnetic field generated by the magnet array 110 and reduce mutual influence between the electricity generating device 100 and an external environment.

In order to achieve miniaturization of a mounting structure, a glass substrate may be employed as the mounting substrate 123, so that miniaturization of the mounting structure may be achieved by processes such as spraying, exposure, etching and the like, so as to achieve miniaturization of the electricity generating device 100. Further, the glass substrate serving as the mounting substrate 123 may ensure, using its own strength, that the electricity generating device 100 is able to withstand a certain pressure from outside, and may function to protect the electricity generating device 100. Also, it is easy to achieve flatness of the glass substrate by uniform spraying, thus a uniform thickness of the electricity generating device 100 can be ensured.

Engineering plastic, resin or the like may be selected as a material of the flexible bodies 122. A process for manufacturing the flexible bodies 122 may be realized by performing coating, patterning and the like on the mounting substrate 123, or may also be realized by a fixed point dripping method.

Figure 5:
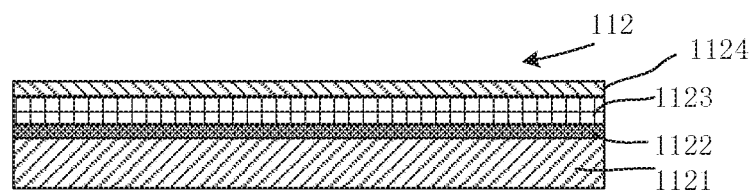
FIG. 5 is a schematic diagram of a structure of a magnet in an electricity generating device according to an embodiment of the present disclosure.

In order to further effectively reduce a volume of the magnet 112 in the magnet array 110, the magnet 112 may be a thin film magnet. The thin film magnet may be formed by plating a substrate formed of a non-magnetic-conducive material with a uniform layer of magnetic film, recording magnetic signals with alternating positive and negative polarities and with equal intervals therebetween, and providing a protection layer on a surface of the magnetic film. Specifically, as shown in FIG. 5, the magnet 112 as a thin film magnet may be formed by plating the substrate 1121 with a bottom layer 1122, then plating the bottom layer 1122 with a function layer 1123 which is a uniform magnetic film, and then plating the function layer 1123 with an insulation layer 1124.

In an embodiment of the present disclosure, thicknesses of respective layers in the thin film magnet (e.g. magnet 112 of FIG. 5) may be determined according to test results, for example, a thickness of the bottom layer 1122 may be 0.03 mm~0.08 mm, a thickness of the function layer 1123 may be 0.15 mm~0.45 mm, a thickness of the insulation layer 1124 may be 0.08 mm~0.12 mm. Preferably, a thickness of the bottom layer 1122 may be 0.05 mm, a thickness of the function layer 1123 may be 0.03 mm, and a thickness of the insulation layer 1124 may be 0.1 mm. The substrate 1121 may be prepared using non-magnetic-conducive material, for example, the substrate 1121 may be a glass substrate that ensures uniformity of a thickness of the magnet.

Figure 6:
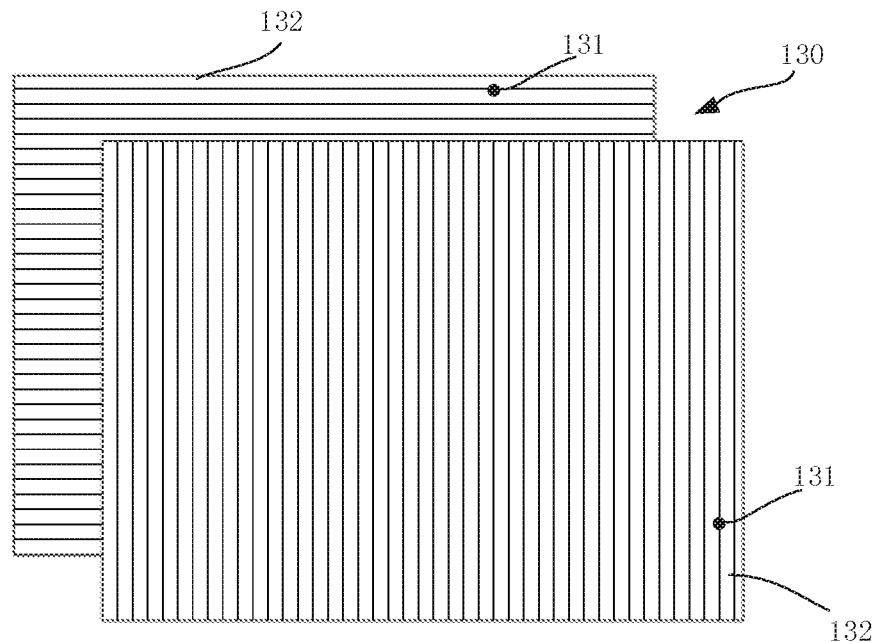
FIG. 6 is a schematic diagram of a structure of an inductive body in an electricity generating device according to an embodiment of the present disclosure.

In order to improve an efficiency with which the metal wires in the inductive body 130 cut magnetic lines, thereby to improve electricity generating efficiency, as shown in FIG. 6, the inductive body 130 may include one or more wire layers 132, and in each of the wire layers 132, a plurality of metal wires 131 may be arranged in one direction.

In order to reduce mutual interference between induced EMFs generated in adjacent wire layers 132, thereby to improve electricity generating efficiency, there may be a preset angle between directions along which metal wires 131 in adjacent wire layers 132 are arranged (e.g. 90 degrees in a case of perpendicular arrangement), as shown in FIG. 6. In this case, when the magnet array 110 moves relative to the inductive body 130 in different directions, metal wires 131 in the inductive body 130 can always cut magnetic lines 111, thereby preventing a case where an induced EMF is generated only if the movement is in one particular direction.

Preferably, directions of arrangement of metal wires 131 in adjacent wire layers 132 may be orthogonal to each other (i.e. perpendicular arrangement with a preset angle of 90 degrees). Directions in which metal wires 131 in each wire layer 132 are arranged may be approximately parallel to each other, and an edge region of the wire layer 132 may be provided with a metal wire connecting wire for adjusting an appropriate waveform of an induced EMF.

Figure 7:
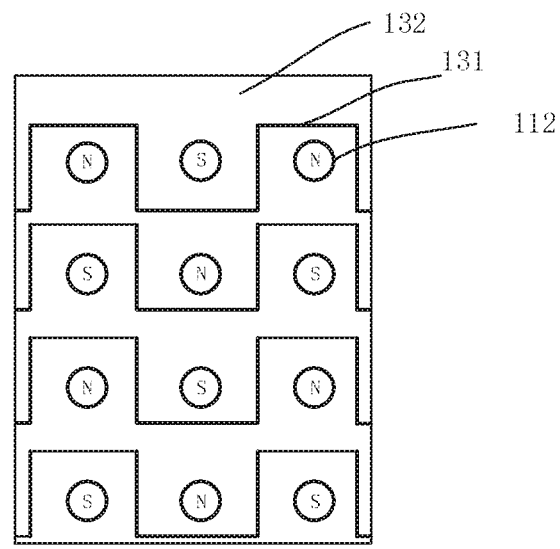
FIG. 7 is a schematic diagram of a structure of an inductive body in an electricity generating device according to an embodiment of the present disclosure.

In order to further improve electricity generating efficiency, an area by which the metal wires 131 incise the magnetic lines 111 may be increased. Specifically, as shown in FIG. 7, metal wires 131 in each wire layer 132 may be arranged in a shape of rectangular wave, wherein each metal wire 131 successively half-surrounds magnets 112 in the magnet array 110. Specifically, when viewed downward from above the inductive body 130, a metal wire 131 first extends by a distance in a horizontal direction to pass by one magnet 112, and extends by a distance in a vertical direction to pass by the magnet 112, and then extends by a distance in the horizontal direction to pass by a next magnet 112 adjacent to the previous magnet 112, and extends by a distance in the vertical direction to pass by the next magnet 112, and so on, until the metal wire 131 extends to an edge of the inductive body 130. In such an arrangement, metal wires 131 of a single wire layer 132 are arranged in two approximately orthogonal directions, thus, magnetic lines 111 can be incised in at least two directions, to increase electricity generating efficiency.

While the above description only describes a case where a metal wire 131 half-surrounds one magnet 112, there may be multiple magnets 112 half-surrounded by one metal wire 131, as long as it is ensured that metal wires 131 are arranged in at least two directions. For simplicity, adjacent metal wires 131 may be arranged approximately parallel to each other, so that wiring is easy and production efficiency is increased. Further, in order to adjust a waveform of induced EMF generated in the metal wires 131 to achieve an effect in which induced EMFs generated in respective metal wires 131 are superimposed with each other, a metal wire connecting wire may be provided in an edge region of the wire layer 132.

Figure 14:
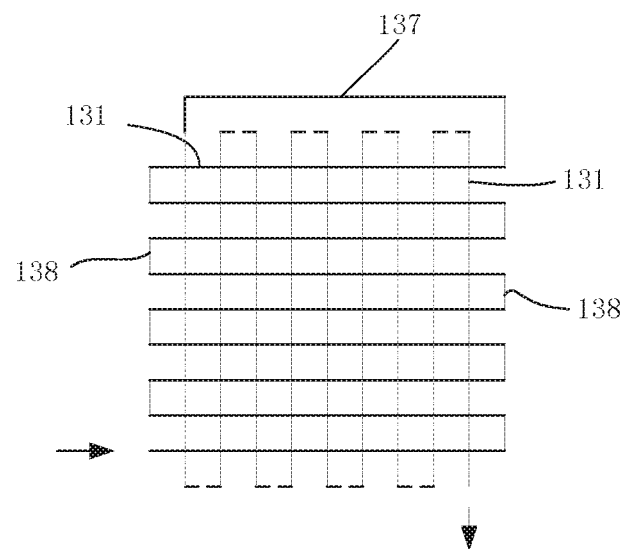
FIG. 14 is a schematic diagram of a structure of an inductive body in an electricity generating device according to an embodiment of the present disclosure.

As shown in FIG. 14, the metal wire connecting wire may include an intra-layer connecting wire 138 for connecting adjacent metal wires 131 within one wire layer 132. The intra-layer connecting wire 138 successively and alternately connects respective ends of adjacent metal wires 131 on one side and on the other side in one wire layer 132, such that induced EMFs generated in respective metal wires 131 are superimposed to obtain a larger induced EMF. The metal wire connecting wire may also include an interlayer connecting wire 137 connecting metal wires 131 of adjacent wire layers 132, such that induced EMFs generated in metal wires 131 of adjacent wire layers 132 are superimposed to obtain a higher induced EMF.

Figure 8:
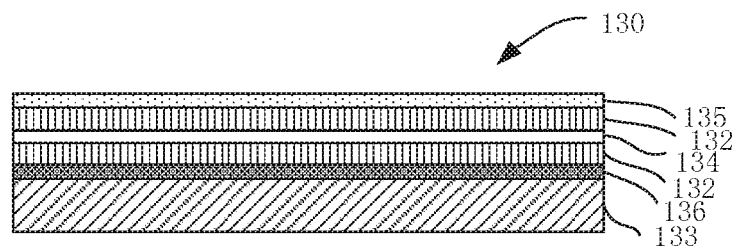
FIG. 8 is a schematic diagram of a structure of an inductive body in an electricity generating device according to an embodiment of the present disclosure.

As shown in FIG. 8, in an embodiment of the present disclose, a dielectric layer 134 may be provided between wire layers 132 in the inductive body 130, for preventing EMF generating efficiency from decreasing due to short circuiting between metal wires 131 of adjacent wire layers 132. Specifically, an attachment layer 136 may be provided on a substrate 133, and a wire layer 132 may be provided on the attachment layer 136, and then a protection layer 135 may be provided on the wire layer 132. When there are multiple wire layers 132, a dielectric layer 134 may be provided on the wire layer 132, and another wire layer 132 may be provided on the dielectric layer 134, and so on (that is, the dielectric layer 134 is provided between adjacent wire layers 132), and finally a protection layer 135 may be provided on an uppermost wire layer 132.

The inductive body 130 may be formed by a process of plating and etching. For example, first the substrate 133 may be plated with the attachment layer 136, then the attachment layer 136 may be plated with the wire layer 132, and metal wires 131 of the wire layer 132 may be etched by exposure and etching processes. When there are multiple wire layers 132, the wire layer 132 may be plated with the dielectric layer 134, and the dielectric layer 134 may be plated with another wire layer 132, and so on. After forming the last wire layer 132, it may be plated with the protection layer 135. When there is only one wire layer 132, the wire layer 132 may be plated with the protection layer 135.

In an embodiment of the present disclose, the substrate 133 may be a glass substrate, and a material of the dielectric layer 134 may be aluminum oxide. A thickness of the attachment layer 136 may be 0.05 mm, a thickness of the wire layer 132 may be 0.3 mm, a thickness of the dielectric layer 134 may be 0.1 mm, and a thickness of the protection layer 135 may be 0.05 mm. Thicknesses of these layers can be changed as necessary, to effectively reduce a width of the inductive body 130, so that overall volume and weight of the electricity generating device 100 is reduced, which is advantageous for use in a wearable apparatus.

The inductive body 130 may be provided integrally with the mounting substrate 123. That is, the attachment layer 136, the wire layer 132, the dielectric layer 134 and the protection layer 135 may be provided on the mounting substrate 123. The inductive body 130 may be provided at either one of both sides (upper side and low side) of the mounting substrate 123. When the inductive body 130 is provided at an upper side of the mounting substrate 123, the flexible bodies 122 may be formed on the protection layer 135 by a process such as coating, exposure, etching, dripping or the like. When the inductive body 130 is provided at a lower side of the mounting substrate 123, the flexible bodies 122 may be formed at the upper side of the mounting substrate 123. In this case, it is easy to achieve a more compact structure and smaller overall thickness of the electricity generating device 100.

Figure 9:
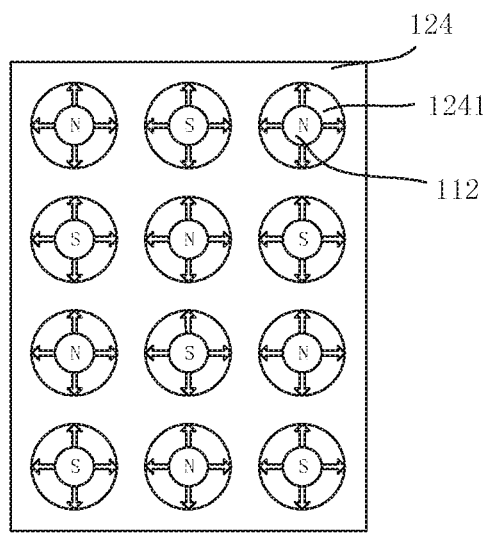
FIG. 9 is a schematic diagram of a structure of a magnet mounting structure in an electricity generating device according to an embodiment of the present disclosure.
Figure 10:
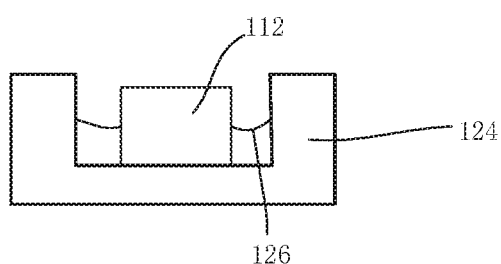
FIG. 10 is a schematic diagram of a structure of a magnet mounting structure in an electricity generating device according to an embodiment of the present disclosure.

FIG. 9 shows another structure of a magnet mounting structure 120 in an electricity generating device according to an embodiment of the present disclosure. As shown in FIG. 9, the magnet mounting structure 120 may include mounting cavity board 124 and a plurality of micro cavities 1241 provided in the mounting cavity board 124. The magnets 112 of the magnet array 110 are mounted in the micro cavities 1241, respectively. As shown in FIG. 10, there may be a flexible connector, such as a flexible rope 126, connected between a magnet 112 and a sidewall of a micro cavity 1241. When the mounting cavity board 124 is subject to a driving force, the magnet 112 may move relative to the mounting cavity board 124, that is, the magnet 112 may move relative to the magnet mounting structure 120, such that metal wires 131 in the inductive body 130 fixed to the magnet mounting structure 120 incise magnetic lines 111 of the magnets 112, so that an induced EMF is generated in the metal wires 131. Since the flexible rope 126 restricts the motion of the magnet 112, it can be ensured that the magnet 112 moves within the micro cavity 1241 without leaving the micro cavity 1241, thereby preventing the electricity generating device 100 from damage.

Besides the flexible rope 126, the flexible connector may also be a connecting body including a hinge, with one end connected to a sidewall of the micro cavity 1241 and the other end connected to the magnet 112. When the magnet 112 starts to move relative to the magnet mounting structure 120, the magnet 112 may cause the hinge of the connecting body to rotate, and when the magnet 112 moves to a certain range, the hinge of the connecting body may restrict the motion of the magnet 112. For example, when the magnet 112 is inclined to move out of the micro cavity 1241, the connecting body may restrict the magnet 112 not to move out of the micro cavity 1241.

Figure 11:
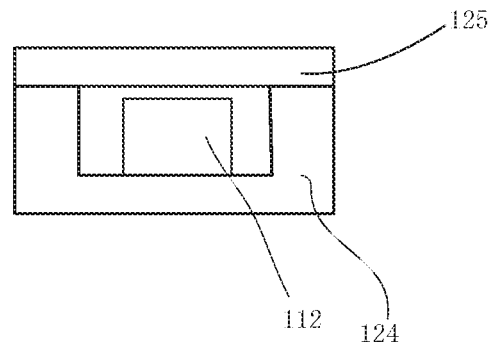
FIG. 11 is a schematic diagram of a structure of a magnet mounting structure in an electricity generating device according to an embodiment of the present disclosure.

FIG. 11 shows another structure of a mounting cavity board 124 in an electricity generating device according to an embodiment of the present disclosure. As shown in FIG. 11, a plurality of micro cavities 1241 may be provided in the mounting cavity board 124, and a magnet 112 of the magnet array 110 is freely placed in a micro cavity 1241, a magnetic emerging surface (that is, a surface perpendicular to a direction in which magnetic lines are emitted) of the magnet 112 may face an opening of the micro cavity 1241, to ensure that the inductive body 130 is sufficiently covered by a space where the magnetic lines 111 are located. In order to enable the magnet 112 to move relative to the mounting cavity board 124 without departing from the micro cavity 1241, a restriction board 125 may be provided at the opening of the micro cavity 1241, to ensure that the magnet 112 only moves in the micro cavity 1241.

The direction in which magnetic lines of the magnet 112 are emitted may be consistent with a height direction of the micro cavity 1241, and a width direction of the magnet 112 may be vertical to the direction in which magnetic lines of the magnet 112 are emitted. The width of the magnet 112 may be limited to avoid a case in which magnetic pole surfaces are turned over while the magnet 112 is moving relative to the mounting cavity board 124 and thus cause interference to an induced EMF. For example, a maximum value of the width of the magnet 112 may be limited to be smaller than a height of the micro cavity 1241, wherein the height of the micro cavity 1241 is defined as: a distance from a surface in the micro cavity 1241 contacting the magnet 112 (i.e. a bottom surface of the micro cavity 1241) to a bottom surface of the restriction board 125.

Figure 15:
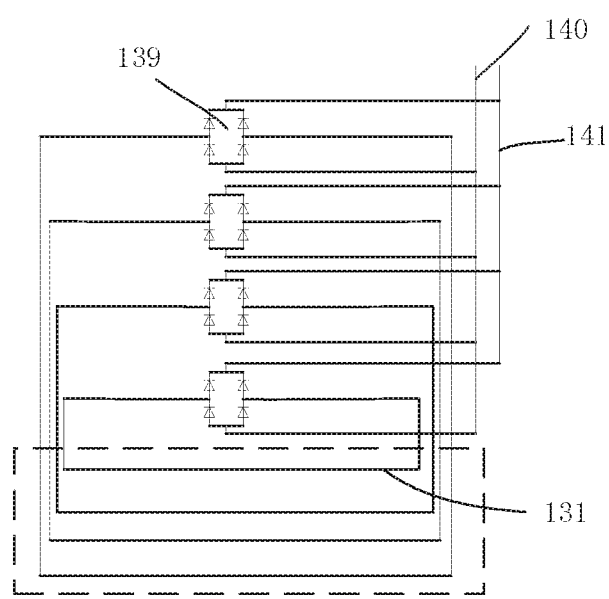
FIG. 15 is a schematic diagram of a structure of an inductive body in an electricity generating device according to an embodiment of the present disclosure.
Figure 16:
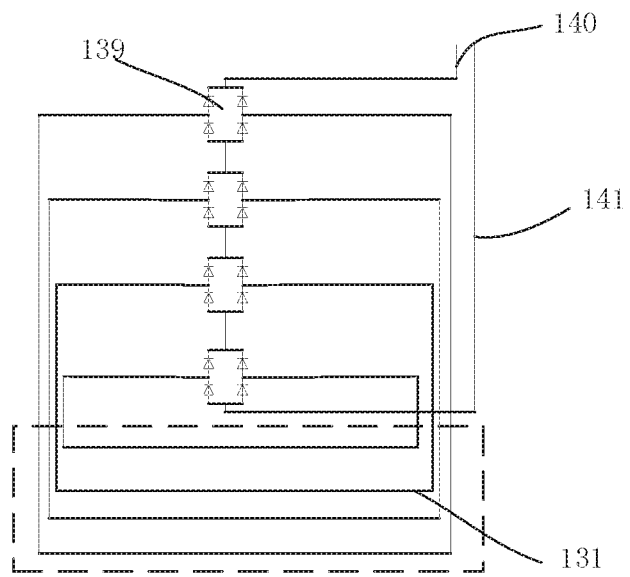
FIG. 16 is a schematic diagram of a structure of an inductive body in an electricity generating device according to an embodiment of the present disclosure.

As shown in FIGS. 15 and 16, the electricity generating device 100 according to en embodiment of the present disclose may also include a rectifier circuit 139. Since directions in which currents generated in metal wires 131 of the electricity generating device 100 flow are not unique, an output efficiency may be affected. By the rectifier circuit 139, the currents generated by the metal wires 131 may be limited to be outputted in one direction, ensuring constancy of output current directions, thereby enabling more efficient utilization of output electric energy.

Figure 17:
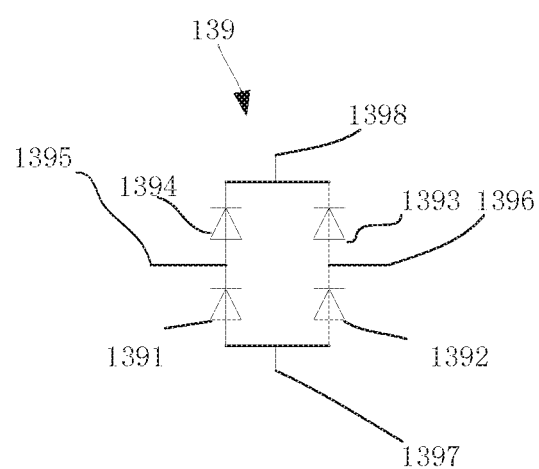
FIG. 17 is a schematic diagram of a structure of a rectifier circuit in an electricity generating device according to an embodiment of the present disclosure.

As shown in FIG. 17, the rectifier circuit 139 may include four diodes, which are a first diode 1391, a second diode 1392, a third diode 1393 and a fourth diode 1394. The rectifier circuit 139 may also include a first input terminal 1395, a second input terminal 1396, a first output terminal 1397 and a second output terminal 1398. An anode of the first diode 1391 is connected to the first output terminal 1397, an anode of the second diode 1392 is connected to the first output terminal 1397, a cathode of the first diode 1391 is connected to the first input terminal 1395, an anode of the fourth diode 1394 is connected to the first input terminal 1395, a cathode of the fourth diode 1394 is connected to the second output terminal 1398, a cathode of the third diode 1393 is connected to the second output terminal 1398, a cathode of the second diode 1392 is connected to the second input terminal 1396, an anode of the third diode 1393 is connected to the second input terminal 1396.

The electricity generating device 100 may include a plurality of rectifier circuits 139, and the plurality of rectifier circuits 139 may be connected in series or in parallel. When the plurality of the rectifier circuits 139 are connected in series, a voltage generated by the electricity generating device 100 may increase, and when the plurality of the rectifier circuits 139 are connected in parallel, a current generated by the electricity generating device 100 may increase.

As shown in FIG. 15, the plurality of rectifier circuits 139 may be connected in parallel, and both ends of each metal wire 131 in the electricity generating device 100 may be connected to the first input terminal 1395 and the second input terminal 1396 of a corresponding rectifier circuit 139, respectively, the first output terminal 1397 of each rectifier circuit 139 may be connected to a first output line 140, and the second output terminal 1398 of each rectifier circuit 139 may be connected to a second output line 141. Electric energy generated by the electricity generating device 100 is transmitted outside through the first output line 140 and the second output line 141.

As shown in FIG. 16, the plurality of rectifier circuits 139 may be connected in parallel, and both ends of each metal wire 131 are connected to the first input terminal 1395 and the second input terminal 1396 of a corresponding rectifier circuit 139, respectively. Output terminals of adjacent rectifier circuits 139 may be connected in series, specifically, a second output terminal 1398 of a rectifier circuit 139 may be connected to a first output terminal 1397 of an adjacent rectifier circuit 139, a second output terminal of the last rectifier circuit 139 may be connected to the first output line 140, and a first output terminal 1397 of the first rectifier circuit 139 may be connected to the second output line 141. In this case, an output voltage of the electricity generating device 100 is increased, and the electricity generating device 100 may transmit electric energy to outside for use via the first output line 140 and the second output line 141. It is to be noted that the term "adjacent rectifier circuits 139" only schematically describes positional relationship of the rectifier circuits 139 in the drawings, and in practical applications, correspondence between the rectifier circuits 139 and the metal wires 131 is not limited to the case illustrated in the drawings, and may be changed as necessary to avoid complexity of wiring.

Figure 12:
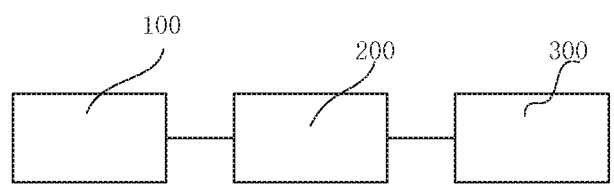
FIG. 12 is a schematic diagram of a structure of an electric source according to an embodiment of the present disclosure.

FIG. 12 is a schematic diagram of a structure of an electric source according to an embodiment of the present disclosure. As shown in FIG. 12, the electric source includes the electricity generating device 100 according to an embodiment of the present disclose, a battery 300 and an electric source control circuit 200. The electricity generating device 100 may be connected to the electric source control circuit 200, the electric source control circuit 200 may be connected to the battery 300, the electricity generating device 100 may charge the battery 300 through the electric source control circuit 200, and the electric source control circuit 200 may control an induced EMF generated by the electricity generating device 100 to or not to be transmitted to the battery 300 according to an amount of electric charge of the battery 300. Specifically, when a voltage of the battery 300 is smaller than a threshold voltage, the battery 300 and the electricity generating device 100 are electrically connected by the electric source control circuit 200, and when a voltage of the battery 300 is greater than or equal to a threshold voltage, the battery 300 and the electricity generating device 100 are electrically disconnected by the electric source control circuit 200, to ensure safe operation of the electric source.

Figure 13:
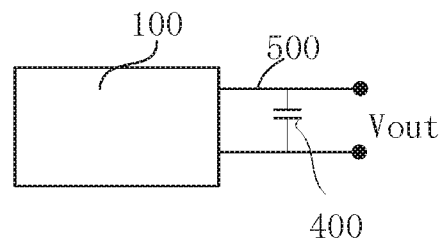
FIG. 13 is a schematic diagram of a structure of a sensor according to an embodiment of the present disclosure.

FIG. 13 is a schematic diagram of a structure of a sensor according to an embodiment of the present disclosure. As shown in FIG. 13, the sensor includes the electricity generating device 100 according to an embodiment of the present disclosure, a capacitor 400 and an output line 500. Two output terminals of the electricity generating device 100 are connected to both ends of the capacitor 400 by the output line 500, respectively. When the electricity generating device 100 is subject to an impact from external force and thus moves, an induced EMF may be generated and outputted from the output line 500. The capacitor 400 connected to the output line 500 plays a function of filtering and energy storage on the generated EMF, so that an output voltage Vout of the sensor is smooth. The impact from an external force received by the electricity generating device 100 may be sensed by detecting the output voltage Vout.

Apparently, the specification has described embodiments of the present disclosure by taking a miniature thin film magnet as an example of the magnet 112. However, in practical applications, larger magnets that can be seen visually may also be applied to the electricity generating device, and one skilled in the art may enlarge sizes of the electricity generating device according to an embodiment of the present disclosure and components thereof as necessary.

It can be understood that the foregoing implementations are merely exemplary implementations used for describing the principle of the present disclosure, but the present disclosure is not limited thereto. Those of ordinary skill in the art may make various variations and modifications without departing from the spirit and essence of the present disclosure, and these variations and modifications shall fall into the protection scope of the present disclosure.

What is claimed is:
1. An electricity generating device, comprising:
a magnet array, and an inductive body having one or more metal wires, the magnet array comprising a plurality of magnets, wherein the inductive body and the magnet array are movable relative to each other; and
a magnet mounting structure, on which the magnet array is mounted, wherein the inductive body is fixed to the magnet mounting structure, and the magnet array is movable relative to the magnet mounting structure;
wherein the magnet mounting structure comprises a mounting substrate and at least one mounting substrate, and one or more magnets of the magnet array are provided on each of the at least one flexible body; or the magnet mounting structure comprises a mounting cavity board with micro cavities provided therein, the magnet of the magnet array is mounted in the micro cavity, a flexible connector is provided within the micro cavity between a sidewall of the micro cavity and the magnet, one end of the flexible connector is connected to the sidewall of the micro cavity, and the other end thereof is connected to the magnet.

2. The electricity generating device according to claim 1, wherein the inductive body comprises one or more wire layers, the metal wires are provided in the wire layers; and in a case where there are more than one wire layers, a dielectric layer is provided between any two adjacent wire layers.

3. The electricity generating device according to claim 2, wherein directions in which metal wires in each of the one or more wire layers are arranged are parallel to each other, or, metal wires in each of the one or more wire layers are arranged in a shape of rectangular wave.

4. The electricity generating device according to claim 3, wherein a metal wire connecting wire configured to adjust an induced electromotive force is provided at an edge of the wire layer, the metal wire connecting wire comprising an intra-layer connecting wire connecting adjacent metal wires within one wire layer; and in a case where there are more than one wire layers, the metal wire connecting wire further comprises an inter-layer connecting wire connecting metal wires of adjacent wire layers.

5. The electricity generating device according to claim 3, wherein in a case where there are more than one wire layers, directions in which the metal wires in adjacent wire layers extend are perpendicular to each other.

6. The electricity generating device according to claim 1, wherein the magnet is a thin film magnet.

7. The electricity generating device according to claim 6, wherein the thin film magnet comprises a glass substrate, a bottom layer provided on the glass substrate, a function layer provided on the bottom layer and an insulation layer provided on the function layer, the function layer is a magnetic film recorded with magnetic signals.

8. The electricity generating device according to claim 7, wherein the function layer is a magnetic film recorded with magnetic signals with alternating positive and negative polarities and with equal intervals therebetween.

9. The electricity generating device according to claim 1, further comprising a rectifier circuit having a first input terminal, a second input terminal, a first output terminal and a second output terminal, both ends of each of the metal wires are connected to the first input terminal and the second input terminal, respectively, the first output terminal and the second output terminal of the rectifier circuit are connected to a first output line and a second output line of the electricity generating device, respectively.

10. The electricity generating device according to claim 9, wherein there are a plurality of metal wires, and there are a plurality of rectifier circuits, the plurality of rectifier circuits are connected in series or in parallel.

11. The electricity generating device according to claim 1, wherein, in a case where the magnet array is moving relative to the inductive body, the metal wires in the inductive body incise magnetic lines of a magnetic field generated by the magnet array.

12. The electricity generating device according to claim 1, wherein the inductive body comprises one or more wire layers, the metal wires are provided in the wire layers; and in a case where there are more than one wire layers, a dielectric layer is provided between any two adjacent wire layers.

13. The electricity generating device according to claim 1, further comprising a rectifier circuit having a first input terminal, a second input terminal, a first output terminal and a second output terminal, both ends of each of the metal wires are connected to the first input terminal and the second input terminal, respectively, the first output terminal and the second output terminal of the rectifier circuit are connected to a first output line and a second output line of the electricity generating device, respectively.

14. The electricity generating device according to claim 1, wherein the magnet mounting structure comprises a plurality of flexible bodies, and the plurality of flexible bodies are arranged approximately parallel to each other with equal heights.

15. An electric source, comprising the electricity generating device according to claim 1, a battery and an electric source control circuit, wherein the electricity generating device is connected to the electric source control circuit, the electric source control circuit is connected to the battery, and the electricity generating device charges the battery through the electric source control circuit.

16. A sensor, comprising the electricity generating device according to claim 1, a capacitor and an output line, wherein two output terminals of the electricity generating device are connected to both ends of the capacitor by the output line, respectively.

* * * * *